(12) United States Patent
Liu et al.

(10) Patent No.: US 11,892,496 B1
(45) Date of Patent: Feb. 6, 2024

(54) METHOD FOR DETERMINING INSULATION THERMOMECHANICAL DETERIORATION OF VPI WIRE ROD OF PUMPED STORAGE POWER GENERATION MOTOR

(71) Applicant: CSG POWER GENERATION CO., LTD. MAINTENANCE AND TEST COMPANY, Guangzhou (CN)

(72) Inventors: Xiangdong Liu, Guangzhou (CN); Liangliang Nie, Guangzhou (CN); Qing Li, Guangzhou (CN); Minghao Huang, Guangzhou (CN); Peng Ling, Guangzhou (CN); Yalin Jia, Guangzhou (CN); Yakang Zhao, Guangzhou (CN); Jun Jiang, Guangzhou (CN); Shidi Tao, Guangzhou (CN); Wenhan Huang, Guangzhou (CN); Xubin Chen, Guangzhou (CN); Chang Xiao, Guangzhou (CN); Xuan Xie, Guangzhou (CN); Haonan Chen, Guangzhou (CN); Pengchao Qi, Guangzhou (CN); Dongyang Hu, Guangzhou (CN); Haixia Yang, Guangzhou (CN); Dejiang Hu, Guangzhou (CN); Yanhong Liu, Guangzhou (CN); Na Zhang, Guangzhou (CN); Yifeng Huang, Guangzhou (CN)

(73) Assignee: CSG POWER GENERATION CO., LTD. MAINTENANCE AND TEST COMPANY, Guangzhou (CN)

( * ) Notice: Subject to any disclaimer, the term of this patent is extended or adjusted under 35 U.S.C. 154(b) by 0 days.

(21) Appl. No.: 18/273,892

(22) PCT Filed: Oct. 27, 2022

(86) PCT No.: PCT/CN2022/127843
§ 371 (c)(1),
(2) Date: Jul. 24, 2023

(87) PCT Pub. No.: WO2023/072174
PCT Pub. Date: May 4, 2023

(30) Foreign Application Priority Data

Nov. 1, 2021 (CN) .......................... 202111284651.4

(51) Int. Cl.
*G01R 31/12* (2020.01)

(52) U.S. Cl.
CPC .............................. *G01R 31/1272* (2013.01)

(58) Field of Classification Search
CPC .... G01R 31/00; G01R 31/12; G01R 31/1227; G01R 31/1263; G01R 31/1272
(Continued)

(56) References Cited

U.S. PATENT DOCUMENTS

| 2,768,246 | A | 10/1956 | Klein |
| 2008/0061631 | A1 | 3/2008 | Fouquet et al. |
| 2017/0155034 | A1 | 6/2017 | Matsuda et al. |

FOREIGN PATENT DOCUMENTS

| CN | 1402015 A | 3/2003 |
| CN | 1402413 A | 3/2003 |

(Continued)

OTHER PUBLICATIONS

Shi, et al., Analysis and Aging Evaluation Method of Frequency-domain Dielectric Spectroscopy for the Motor Stator Insulation, Journal of Electrical Engineering, Jun. 2021, pp. 86-92, vol. 16—Issue 2, China.

(Continued)

*Primary Examiner* — Hoai-An D. Nguyen
(74) *Attorney, Agent, or Firm* — George McGuire

(57) ABSTRACT

Provided is a method for determining insulation thermomechanical deterioration of a VPI wire rod of a pumped storage (Continued)

power generator motor. The method includes: periodically performing a cold-heat cycling test on a wire rod, and performing an insulation dielectric dissipation factor testing and a result interpretation of the insulation dielectric dissipation factor testing before and after each period to obtain corresponding data; in response to determining the interpretation result as the data being qualified, continuing to perform the cold-heat cycling test; and in response to determining the interpretation result as the data being unqualified, striking the wire rod with a copper hammer, and using an acoustic acquisition and analysis system to perform signal processing to determine spectral characteristics in a thermomechanical deterioration state as a deterioration criterion.

6 Claims, 2 Drawing Sheets

(58) Field of Classification Search
USPC .......... 324/500, 537, 750.01, 750.03, 750.11
See application file for complete search history.

(56) References Cited

FOREIGN PATENT DOCUMENTS

| CN | 102364840 | A |   | 2/2012  |             |
|----|-----------|---|---|---------|-------------|
| CN | 105203928 | A |   | 12/2015 |             |
| CN | 204832434 | U |   | 12/2015 |             |
| CN | 105445000 | A |   | 3/2016  |             |
| CN | 108226732 | A |   | 6/2018  |             |
| CN | 207816554 | U |   | 9/2018  |             |
| CN | 108646152 | A |   | 10/2018 |             |
| CN | 208752165 | U |   | 4/2019  |             |
| CN | 208977792 | U |   | 6/2019  |             |
| CN | 111313745 | A |   | 6/2020  |             |
| CN | 111832967 | A |   | 10/2020 |             |
| CN | 114002532 | A |   | 2/2022  |             |
| CN | 217156705 | U | * | 8/2022  | ............ G01R 31/12 |
| JP | H0277664  | A |   | 3/1990  |             |
| JP | H0640723  | B2 | * | 5/1994 | ............ F02M 25/08 |
| JP | 3546046   | B2 | * | 7/2004 | ............ G01R 31/02 |
| JP | 2013088251 | A | * | 5/2013 | ........... G01R 31/343 |
| KR | 20210150185 | A | * | 12/2021 | ........... G01R 31/346 |

OTHER PUBLICATIONS

Tianxin, et. al., High Mechanical Strength Resin-rich Mica Tape (II)—Model Stator Bar Tests, Insulation Materials, 2015, pp. 32-39, vol. 48—Issue 12, China Academic Journal Electronic Publishing House, China.

Nageshwar Rao, et al., Study on Diagnosis of HV Rotating Electrical Machine Insulation Based on Structural Changes Due To Ageing, Proceedings of the 9th International Conference on Properties and Applications of Dielectric Materials, Jul. 19-23, 2009, pp. 208-211, Harbin, China.

Huang et al., Systematic study on insulation performance of grade 24 kV hydro-generator stator bar, Insulation Technology, 2021, pp. 46-50, Issue No. 4, China Academic Journal Electronic Publishing House, China.

Translated International Search Report with original Written Opinion, App. No. PCT/CN2022/127843, dated Dec. 15, 2022, pp. 1-8.
Translation of OA1 of CN prior application, App. No. 202111284651. 4, dated Dec. 20, 2015, pp. 1-13.

* cited by examiner

METHOD FOR DETERMINING INSULATION THERMOMECHANICAL DETERIORATION OF VPI WIRE ROD OF PUMPED STORAGE POWER GENERATION MOTOR

CROSS-REFERENCE TO RELATED APPLICATION

This is a National Stage Application, filed under 35 U.S.C. 371, of International Patent Application No. PCT/CN2022/127843, filed on Oct. 27, 2022, which claims priority to Chinese Patent Application No. 202111284651.4 filed with the China National Intellectual Property Administration (CNIPA) on Nov. 1, 2021, the disclosures of each of which are incorporated herein by reference in their entireties.

This application claims priority to Chinese Patent Application No. 202111284651.4 filed with the China National Intellectual Property Administration (CNIPA) on Nov. 1, 2021, the disclosure of which is incorporated herein by reference in its entirety.

TECHNICAL FIELD

The present application relates to the technical field of insulation thermomechanical deterioration determination of a wire rod, and for example, a method for determining insulation thermomechanical deterioration of a vacuum pressure impregnating (VPI) wire rod of a pumped storage power generator motor.

BACKGROUND

At present, China is in a critical period for green and low-carbon energy transition and development. Large-scale and high-quality development of new energy, such as wind power generation and photovoltaic power generation demands regulated power supplies more urgently. As a regulatable power supply, pumped storage power generation has the most mature technology, the most significant whole life-cycle carbon emission reduction benefits, the best economy and the massive development, and will usher in a stage of great development.

Unlike a conventional hydro-generator unit that provides basic power loads, the main functions of a pumped storage power generator motor are peak shaving and valley filling in the grid, and thus the pumped storage power generator motor unit needs to start and stop frequently. In the process of frequent starting and stopping, the current of the wire rod of a fixed-speed pumped storage power generator motor and the current of a copper conductor in the wire rod of a stator and a rotor of a variable-speed pumped storage power generator motor change drastically, resulting in a sudden change in temperature. Since the copper conductor and epoxy mica insulation have different thermal expansion coefficients, internal shear stress is generated, causing the insulation thermomechanical deterioration, and generating a partial discharge, and in severe cases, an insulation penetrating discharge may occur, causing serious accidents, and threatening the safe operation of the grid.

Thermomechanical deterioration is a unique insulation deterioration characteristic of the pumped storage unit, and the cold-heat cycling test method for testing this characteristic is also formulated based on insulation failure characteristics of pumped storage units operating at home and abroad for many years. The cold-heat cycling test is an acknowledged method for generating the insulation mechanical deterioration in the world, it is possible to determine the mechanical deterioration state through an electric insulation diagnostic test. Due to the limitation of power station site conditions (a "three-electrode" dielectric dissipation factor testing cannot be performed on a single wire rod), it is not possible to determine the insulation thermomechanical deterioration of the operation unit through the electric diagnostic test. A copper hammer striking method is a simple and convenient insulation state detection method applicable to a power station site. This method determines whether the insulation is "hollow" by means of "human ear" identification, where "hollow" means that an air gap exists in the insulation so that it is prone to generate a partial discharge during operation, this method has the defect that the type of insulation deterioration and the discharge severity cannot be determined. Thus, no suitable method has been found so far for determining the insulation thermomechanical deterioration of the pumped storage unit on the power station site.

SUMMARY

An embodiment of the present application provides a method for determining insulation thermomechanical deterioration of a vacuum pressure impregnating (VPI) wire rod of a pumped storage power generator motor.

The present application provides a method for determining insulation thermomechanical deterioration of a VPI wire rod of a pumped storage power generator motor. The method includes the steps described below.

A cold-heat cycling test is periodically performed on the wire rod. An insulation dielectric dissipation factor testing and a result interpretation of the insulation dielectric dissipation factor testing are performed before and after each period to obtain corresponding data.

In response to determining an interpretation result as the data being qualified, it is continued to perform the cold-heat cycling test.

In response to determining an interpretation result as the data being unqualified, the wire rod is struck by a copper hammer, and signal processing is performed by using an acoustic acquisition and analysis system to determine spectral characteristics in a thermomechanical deterioration state as a deterioration criterion.

DETAILED DESCRIPTION

Figure 1:
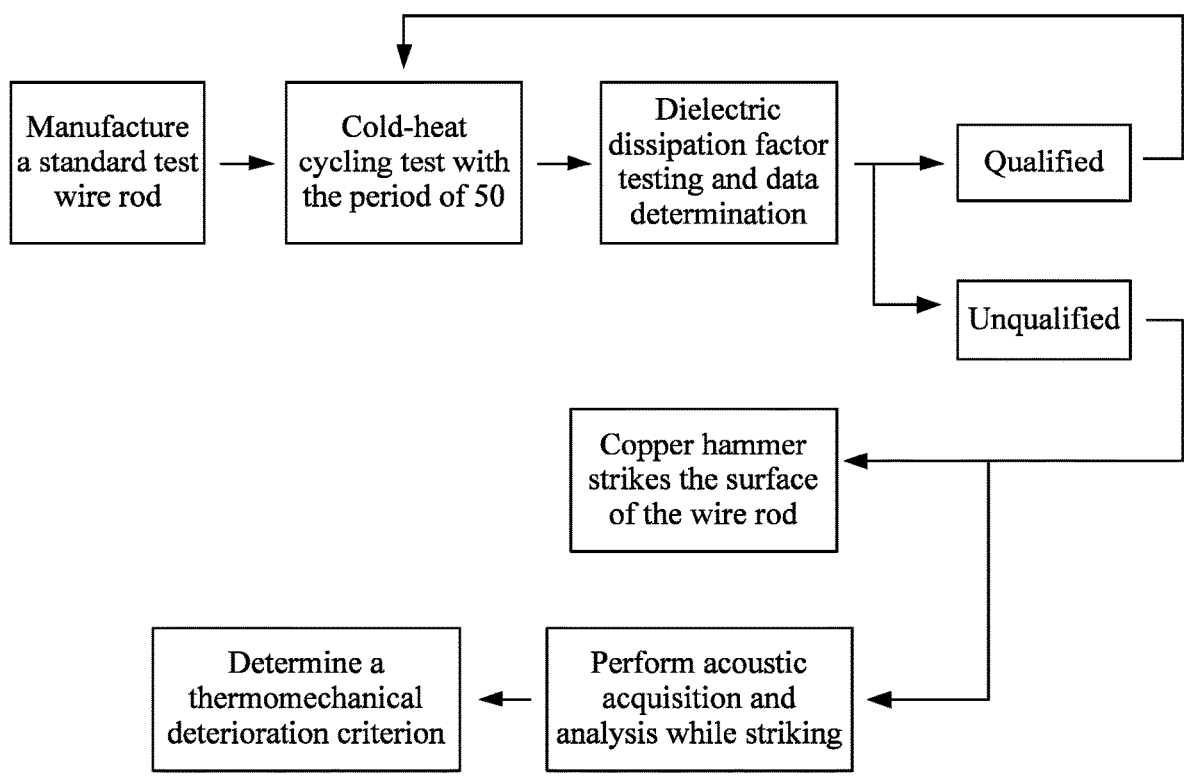
FIG. 1 is a block diagram of the principle of the method according to the present application.

As shown in FIG. 1, a method for determining insulation thermomechanical deterioration of a VPI wire rod of a pumped storage power generator motor includes the steps described below.

The cold-heat cycling test is periodically performed on a wire rod. An insulation dielectric dissipation factor testing and a result interpretation of the insulation dielectric dissipation factor testing are performed before and after each period of the cold-heat cycling test to obtain corresponding data.

If an interpretation result is the data being qualified, the cold-heat cycling test is continued to be performed.

If the interpretation result is the data being unqualified, the wire rod is struck by a copper hammer, and an acoustic acquisition and analysis system is used to perform signal processing so as to determine spectral characteristics in a thermomechanical deterioration state as a deterioration criterion.

In the present application, the insulation thermomechanical deterioration of the VPI wire rod of the pumped storage power generator motor is determined, and the cold-heat cycling test is performed according to an insulation material temperature variation amplitude of an air-cooled pumped storage generator motor during operation. Based on the dielectric dissipation factor change rule of thermomechanical deterioration characteristics during the process of the cold-heat cycling tests, the relationship between the insulation thermomechanical deterioration and the dielectric dissipation factor change trend is determined. For the insulation thermomechanical deterioration state, the widely-used copper hammer striking method is used to perform a wire rod striking test. Meanwhile, the acoustic acquisition and analysis system is used to acquire and analyze striking acoustical signals to determine an acoustics criterion for the thermomechanical deterioration.

For example, the insulation of the wire rod is subjected to electric internal stress, thermal internal stress, mechanical internal stress, and environmental factors during the operation, and the insulation gradually deteriorates as the operation time of the power generator motor unit increases. Different stresses and factors generate different air-gap discharge characteristics, and electric parameter change characteristics of the insulation deterioration are different. The pumped storage power generator motor has the operating condition of frequent starting and stopping, thereby causing the thermomechanical stress between the insulation and the copper conductor and the thermomechanical stress among insulating layers. When serious thermomechanical deterioration occurs on the insulation, continuously and elliptically distributed air gaps are generated among the insulating layers, and the dimension of air gaps in the long axis direction of the wire rod is much larger than the dimension of air gaps in the sectional direction of the wire rod. Insulation deterioration characteristics of a conventional motor unit under the action of continuously multiple internal stresses dominated by the electric stress manifest as discontinuously and approximately spherically distributed air gaps, and the dimension of air gaps in the long axis of the wire rod is approximately equal to the dimension of air gaps in the sectional direction of the wire rod. Different discharge characteristics lead to different change trends of the dielectric dissipation factor, and the insulation thermomechanical deterioration state may be determined through the characteristic trends. The copper hammer striking method as a simple method for detecting the insulation integrity has been applied for many years. A copper hammer striking acoustic response in the insulation thermomechanical deterioration state has unique acoustics characteristics that may be used as the criterion for determining the insulation thermomechanical deterioration on the site.

For example, the wire rod uses a rectangular copper conductor as the inner core. Each of two end surfaces of the copper conductor is provided with several through holes for connection of lead-out wires of a strong current transformer. The middle portion of the copper conductor is wrapped by a dry mica tape. The surface of the dry mica tape is wrapped by a low-resistance strap. Two sides of the low-resistance strap are wrapped by high-resistance anti-halo straps. The wire rod is integrally vacuum-pressure-impregnated for curing and formation. For example, each of the two end surfaces of the copper conductor is provided with four through holes.

In the process of determining the deterioration criterion, the copper hammer is used to strike the insulation surface of a low-resistance area of the wire rod. The low-resistance area of the wire rod is formed at the position where the copper conductor is wrapped around by the low-resistance strap.

The acoustic acquisition and analysis system includes a sound sensor, a sound amplifier, and a data acquisition and analysis system. The acoustic acquisition and analysis system is externally connected to a computer. The acoustic acquisition and analysis system transmits data to the computer. The computer performs a Fourier transform on the data. When one of the following conditions is satisfied, it is determined that the thermomechanical deterioration occurs on the wire rod:

Two or more pulses having amplitude values 10 times greater than a background noise level occur in a frequency range of 3000 Hz±500 Hz; two or more pulses having amplitude values 10 times greater than the background noise level occur in a frequency range of 5000 Hz±500 Hz, or one or more pulses having the amplitude values 15 times greater than the background noise level occur in a frequency range of 9000 Hz±1000 Hz.

For example, the copper hammer is used to strike the insulation surface including the low-resistance area, and meanwhile, an acoustic sensor is used to acquire a response signal of the copper hammer striking. The amplified response signal is transmitted to a data acquisition system and then to the computer through a network. Distribution characteristics of acoustics parameters are determined through Fourier analysis and used as the deterioration criterion.

For example, when the copper hammer is used to strike the insulation surface of the low-resistance area of the wire rod, the sound sensor is used to acquire acoustics signals generated by the copper hammer striking. The acoustics signals are input into the sound amplifier. The amplified acoustics signals are transmitted to the data acquisition and analysis system. The data is transmitted to a remote computer through an industrial Ethernet. The computer performs the Fourier transform on the signals to determine the thermomechanical deterioration characteristics. When one of the following conditions is satisfied, it is determined that the thermomechanical deterioration occurs:

Two or more pulses having amplitude values 10 times greater than a background noise level occur in a frequency range of 3000 Hz±500 Hz; two or more pulses having amplitude values 10 times greater than the background noise level occur in a frequency range of 5000 Hz±500 Hz; or one or more pulses having amplitude values 15 times greater than the background noise level occur in a frequency range of 9000 Hz±1000 Hz.

The temperature of the cold heat cycling test is determined according to the insulation operation temperature of the air-cooled pumped storage power generator motor unit at home and abroad. The heating manner of internal heating and forced ventilation cooling are performed to ensure that a reasonable temperature gradient is generated from inside to outside along the insulation section of the wire rod during the cold-heat cycling tests.

The cold-heat cycling test uses such a manner that the copper conductor is heated by the current and cooled by ventilation. Each period has 50 cycles. Each cycle has the temperature of 40° C. to 130° C. and the temperature ramp rate of 2.5° C./min±1° C./min. 50 cycles are used as one period. The dielectric dissipation factor testing is performed before and after each period. When test data under 0.6 $U_N$ reaches the maximum value, increases from 0.2 $U_N$ to 0.6 $U_N$, decreases from 0.6 $U_N$ to 1.2 $U_N$, and has a significant negative increment at 1.0 $U_N$, it is determined that significant thermomechanical deterioration occurs on the insulation.

In the insulation dielectric dissipation factor testing, the testing voltage includes 0.2 $U_N$, 0.4 $U_N$, 0.6 $U_N$, 0.8 $U_N$, 1.0 $U_N$, and 1.2 $U_N$, where $U_N$ is the rated line voltage. When magnitudes measured at multiple voltage points satisfy the following conditions at the same time, it is determined that the data is unqualified; and in other cases, it is determined that the data is qualified:

magnitude (0.2 $U_N$)<magnitude (0.4 $U_N$)<magnitude (0.6 $U_N$).

magnitude (1.2 $U_N$)<magnitude (1.0 $U_N$)<magnitude (0.8 $U_N$)<magnitude (0.6 $U_N$);

a difference between the magnitude (0.6 $U_N$) and the magnitude (0.2 $U_N$)>1%; and magnitude (0.2 $U_N$)>1%

In the present application, the cold-heat cycling test is performed by using 50 cycles as one period. The insulation dielectric dissipation factor testing and the result interpretation of the insulation dielectric dissipation factor testing are performed before and after each period. If the data is qualified, it is continued to perform the cold-heat cycling test. If the data is unqualified, the copper hammer is used to strike the surface of the wire rod, meanwhile, the acoustic acquisition and analysis system is used to perform the signal processing, and the spectral characteristics in the thermomechanical deterioration state are determined as the deterioration criterion and used for the insulation thermomechanical deterioration evaluation of a removed wire rod and the insulation thermomechanical deterioration evaluation of the wire rod at the phasic testing after the unit operates.

In an embodiment of the present application, the rectangular copper conductor is used as the inner core of the test wire rod. The rectangular copper conductor has a sectional dimension of 100 mm*22 mm and a total length of 4500 mm. Each of the two end large surfaces of the copper conductor is drilled with four through holes of Φ14 for connection of the lead-out wires of the strong current transformer.

The middle portion of the copper conductor is wrapped by the dry mica tape having the length of 4100 mm. After the vacuum pressure impregnating (VPI) process, the insulation surface in a middle range of 3200 mm is wrapped by a semiconductor low-resistance anti-halo strap. Two sides of the low-resistance strap are wrapped by a semiconductor high-resistance anti-halo strap. The overlapping length between the low-resistance anti-halo strap and the high-resistance anti-halo strap is 20 mm. The high-resistance anti-halo structure has the total length of 140 mm. The copper conductor is put in an oven to be heated, cured and formed.

The dielectric dissipation factor testing is performed before and after each period. The electrode structure is a three-electrode structure. The test voltages are 0.2 $U_N$, 0.4 $U_N$, 0.6 $U_N$, 0.8 $U_N$, 1.0 $U_N$, and 1.2 $U_N$, where $U_N$ is the rated line voltage. Unlike the conventional hydro-generator unit taking the electric stress deterioration as the main aging manner, the thermomechanical deterioration causes significant layering between the insulation and the copper conductor and between the insulation layers, and the change rule of the dielectric dissipation factor is significantly different as the voltage increases. On the basis of summarizing the change rules of a large number of thermomechanical deterioration characteristic parameters, the deterioration criterion is determined. When magnitudes measured at multiple voltage points satisfy the following conditions at the same time, the data is determined to be unqualified; and in other cases, the data is determined to be qualified:

magnitude (0.2 $U_N$)<magnitude (0.4 $U_N$)<magnitude (0.6 $U_N$);

magnitude (1.2 $U_N$)<magnitude (1.0 $U_N$)<magnitude (0.8 $U_N$)<magnitude (0.6 $U_N$);

a difference between the magnitude (0.6 $U_N$) and the magnitude (0.2 $U_N$)>1%; and magnitude (0.2 $U_N$)>1%.

Figure 2:
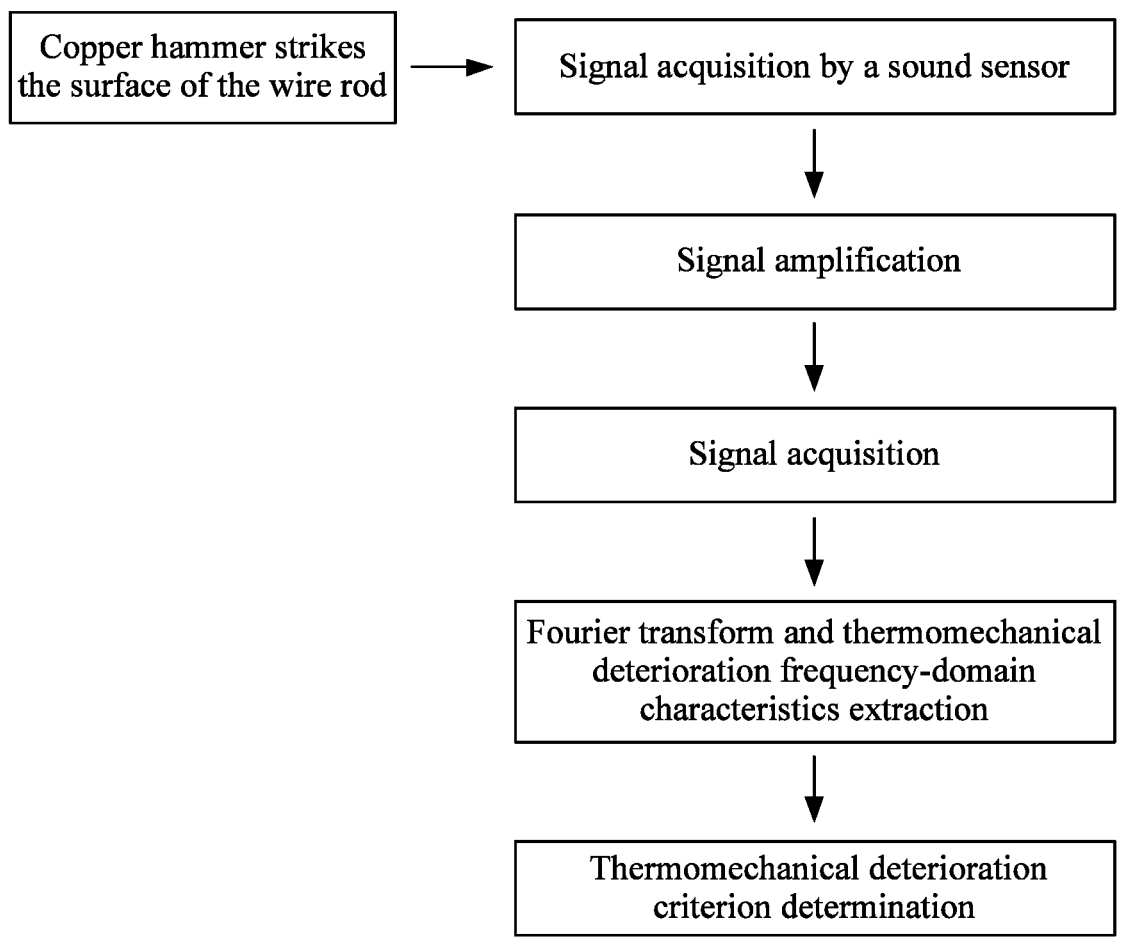
FIG. 2 is a block diagram of the principle of acoustic measurement and analysis of the present application.

As shown in FIG. 2, when the data is unqualified, a solid copper hammer is used to strike the insulation surface of the low-resistance anti-halo area of the wire rod, and meanwhile, a B&K acoustics sensor is installed near the tested area. The copper hammer strikes the main insulation to generate a frequency response, and the measured acoustics response signal is transmitted to a B&K-1704 acoustics amplifier. After an amplification gain is set according to the on-site noise environment, the amplified acoustics signal is transmitted to an NI-9185 data acquisition and analysis system. The data is transmitted to the computer through the industrial Ethernet. The computer performs the Fourier transform on the signal to determine the thermomechanical deterioration characteristics. When one of the following conditions is satisfied, the thermomechanical deterioration is determined to occur:

Two or more pulses having amplitude values 10 times greater than a background noise level occur in a frequency range of 3000 Hz±500 Hz; two or more pulses having amplitude values 10 times greater than the background noise level occur in a frequency range of 5000 Hz±500 Hz; or one or more pulses having amplitude values 15 times greater than the background noise level occur in a frequency range of 9000 Hz±1000 Hz.

In the embodiments of the present application, the corresponding relationship between the unique electric characteristics of the insulation thermomechanical deterioration of the pumped storage power generator motor and the acoustics characteristics of the copper hammer striking method is established and applicable to the insulation thermomechanical deterioration state evaluation on the stator winding and the wire rod of the fixed-speed pumped storage power generator motor as well as the stator winding and the wire rod of the variable-speed pumped storage power generator motor on the power station site, the insulation thermomechanical deterioration state can be effectively detected, and the present application helps take early precautions, and provides a significant and necessary detection method to ensure the safe and reliable operation of the pumped storage unit. When the unit is detected, since the three-electrode system cannot be used for the dielectric dissipation factor testing, the anti-halo coating state and the insulation at the end of the wire rod may greatly affect the result of the overall dielectric dissipation factor testing, and electric parameters cannot be used as the criterion for determining the insulation thermomechanical deterioration. The method in which the copper hammer striking is combined with the acoustics determination is simple, no high-voltage power needs to be externally connected, the criterion is clear, and whether the insulation has thermomechanically deteriorated can be quickly confirmed. The method is a significant and necessary means for detecting the insulation deterioration characteristics of the pumped storage power generator motor unit having the peak-shaving and valley-filling operating conditions.

What is claimed is:

1. A method for determining insulation thermomechanical deterioration of a vacuum pressure impregnating (VPI) wire rod of a pumped storage power generator motor, comprising:
    periodically performing a cold-heat cycling test on the wire rod, and performing an insulation dielectric dissipation factor testing and a result interpretation of the insulation dielectric dissipation factor testing before and after each period of the cold-heat cycling test to obtain corresponding data;
    in response to determining an interpretation result as the data being qualified, continuing to perform the cold-heat cycling test; and
    in response to determining the interpretation result as the data being unqualified, striking the wire rod with a copper hammer, and performing signal processing by using an acoustic acquisition and analysis system to determine spectral characteristics in a thermomechanical deterioration state as a deterioration criterion;
    wherein the cold-heat cycling test uses a manner that the copper conductor is heated by a current and cooled by ventilation, each period of the cold-heat cycling test has 50 cycles, and each of the 50 cycles has a temperature of 40° C. to 130° C. and a temperature ramp rate of 2.5° C./min±1° C./min:
    wherein in the insulation dielectric dissipation factor testing, testing voltages comprise 0.2 $U_N$, 0.4 $U_N$, 0.6 $U_N$, 0.8 $U_N$, 1.0 $U_N$, and 1.2 $U_N$, wherein $U_N$ is a rated line voltage; and the method comprises: in response to determining that magnitudes measured at a plurality of voltage points satisfy the following conditions at the same time, determining that the data is unqualified; and in response to determining that the magnitudes measured at the plurality of voltage points do not satisfy the following conditions at the same time, determining that the data is qualified:
    a magnitude measured at 0.2 $U_N$<a magnitude measured at 0.4 $U_N$<a magnitude measured at 0.6 $U_N$' a magnitude measured at 1.2 $U_N$<a magnitude measured at 1.0 $U_N$<magnitude measured at 0.8 $U_N$<the magnitude measured at 0.6 $U_N$;
    a difference between the magnitude measured at 0.6 $U_N$ and the magnitude measured at 0.2 $U_N$>1%; and the magnitude measured at 0.2 $U_N$>1%.

2. The method of claim 1, wherein the wire rod uses a rectangular copper conductor as an inner core, each of two end surfaces of the copper conductor is provided with a plurality of through holes, a middle portion of the copper conductor is wrapped by a dry mica tape, a surface of the dry mica tape is wrapped by a low-resistance strap, two sides of the low-resistance strap are wrapped by a high-resistance anti-halo strap, and the wire rod is integrally vacuum pressure impregnated for curing and formation.

3. The method of claim 2, wherein a process of determining the deterioration criterion comprises striking an insulation surface of a low-resistance area of the wire rod by using the copper hammer; wherein the low-resistance area of the wire rod is formed at a position where the copper conductor is wrapped around by the low-resistance strap.

4. The method of claim 3, wherein each of the two end surfaces of the copper conductor is provided with four through holes used for connection of lead-out wires of a strong current transformer.

5. The method of claim 1, wherein the acoustic acquisition and analysis system comprises a sound sensor, a sound amplifier, and a data acquisition and analysis system, and the acoustic acquisition and analysis system is externally connected to a computer.

6. The method of claim 5, comprising: transmitting, by the acoustic acquisition and analysis system, the data to the computer, performing, by the computer, a Fourier transform on the data, and in response to determining that one of the following conditions being satisfied, determining that thermomechanical deterioration occurs on the wire rod:
    at least two pulses having amplitude values 10 times greater than a background noise level occur in a frequency range of 3000 Hz±500 Hz;
    at least two pulses having amplitude values 10 times greater than a background noise level occur in a frequency range of 5000 Hz±500 Hz; or
    at least one pulse having an amplitude value 15 times greater than a background noise level occurs in a frequency range of 9000 Hz±1000 Hz.

* * * * *